(12) United States Patent
Yang

(10) Patent No.: US 6,924,886 B2
(45) Date of Patent: Aug. 2, 2005

(54) METHOD FOR DETECTING FLARE NOISE OF SEMICONDUCTOR DEVICE

(75) Inventor: Jin-Seok Yang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 52 days.

(21) Appl. No.: 10/330,175

(22) Filed: Dec. 30, 2002

(65) Prior Publication Data

US 2003/0214642 A1 Nov. 20, 2003

(30) Foreign Application Priority Data

May 17, 2002 (KR) ......................................... 2002-27316

(51) Int. Cl.[7] ........................ G03B 27/32; G03B 27/42; G03F 9/00
(52) U.S. Cl. ................ 355/77; 355/53; 430/5
(58) Field of Search ............................. 355/77, 53, 75, 355/67; 430/5, 322; 382/144; 356/399

(56) References Cited

U.S. PATENT DOCUMENTS

2003/0068565 A1 * 4/2003 Ki et al. .................... 430/5
2003/0197865 A1 * 10/2003 Shiode ..................... 356/399

* cited by examiner

Primary Examiner—Peter B. Kim
(74) Attorney, Agent, or Firm—Birch, Stewart, Kolasch & Birch, LLP

(57) ABSTRACT

A method for instantaneously detecting flare noise within patterns of the semiconductor device, which includes the steps of preparing a mask having a plurality of exposed areas having different light energy levels when being photo exposed and providing a plurality of dummy patterns with different sizes for detecting flare noises in each exposed area; forming dummy patterns on a wafer through a photolithography process with the mask; and detecting the flare noise by comparing the dummy patterns in each exposed area with an optical microscope.

5 Claims, 4 Drawing Sheets

METHOD FOR DETECTING FLARE NOISE
OF SEMICONDUCTOR DEVICE

FIELD OF THE INVENTION

The present invention relates to a method for detecting flare noise of photo exposure equipment; and, more particularly, to a method for detecting flare noise of a semiconductor device capable of an instantaneous detection through the use of the Kirk's method or modifications of a mask layout.

DESCRIPTION OF RELATED ARTS

Generally, flare noise is a kind of light noise that wonders around a lens regardless of the light passing through a mask pattern due to defects in the lens of photo exposure equipment itself or due to scatterings at an incomplete anti-reflective coating (hereinafter referred as to ARC) or a mask and becomes incident light to a wafer. Especially, an illumination optic mainly causes this flare noise since it is generally not processed with a complete ARC process compared to a projection optic.

Also, flare noise is observed when incident light is scattered because of the above-described unstable lens elements. Moreover, flare noise causes an increase in intensity of the overall light and an irregular distribution of light, which, in turn, results in a decrease in contrast of the Aerial image or an excessive photo exposure at an overly exposed open area of the mask. Therefore, there is ultimately observed a decrease in uniformity of critical dimensions (hereinafter referred as to CD) and a process margin.

Flare noise with photo exposure equipment has been a known problem. In fact, flare noise is currently considered as a main cause of a decrease in uniformity of CD's and the process margin since design rules for a semiconductor device have recently reached its limitation and uniformities of the CD and illumination recently are extensively emphasized.

Meanwhile, among the methods for detecting flare noise, there has been commonly employed a method wherein a device is inspected in a predetermined period by using a specific function included in a photo exposure equipment or a test mask. The firefly method and the Kirk's method are the most well-known methods for detecting flare noise.

Unfortunately, since the above two representative methods are highly complex, the inspection period cannot be shortened into a preset extent of time. Also, even if flare noise occurs, it is detected after damages of patterns have already taken place in a number of devices. Hence, it is required to develop a new innovative method for complementing the existing detection methods.

SUMMARY OF THE INVENTION

It is, therefore, an object of the present invention to provide a method for detecting flare noise of a semiconductor device capable of instantaneous detection at a semiconductor pattern.

In accordance with an aspect of the present invention, there is provided a method for detecting flare noise in a semiconductor device, comprising the steps of: preparing a mask having a plurality of exposed areas having different light energy levels when photo exposing and a plurality of dummy patterns with different sizes for detecting flare noises in each expose-area; forming dummy patterns on a wafer through a photolithography process with the mask; and detecting the flare noise by comparing the dummy patterns in each exposed area with an optical microscope.

Preferably, at the step of duplicating the dummy pattern on the wafer, the light energy level of incident light for each area will vary in accordance with the number of superposed shots. Areas where the shots are superposed include scribe lanes, and the dummy pattern is formed in a shape of square. Also, the step of detecting the flare noise includes further steps of: preparing first relation among the flare noise, a variation of energy and a fitting coefficient from sample dummy patterns having same size, wherein the fitting coefficient denotes variations of the flare noise according the variation of the energy; preparing second relations among a specific energy, the fitting coefficient and the size of dummy patterns which are not formed or deformed at the specific energy; finding a specific fitting coefficient corresponding to the specific energy and the size of dummy patterns which are not formed or deformed from the second relations by comparing the dummy patterns in each expose-area with optical microscope; and finding the flare noise corresponding to the specific coefficient from the first relations.

It is generally thought to observe continuously a critical dimension (CD) affected by the flare noise on a real pattern. However, use of this method that employs precision, CD measuring equipment causes a problem in decreasing overall yields of semiconductor devices. Accordingly, it is necessary to put efforts to develop the kirk's method on a mask of a semiconductor device, wherein a simple maneuvering of an optical microscope is applied for detecting the flare noise. In connection with this aim, the present invention provides a method for detecting the flare noise by using the mask layout and a characteristic of superposition of neighboring shots when photo-exposing through the use of photo exposure equipment.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1:
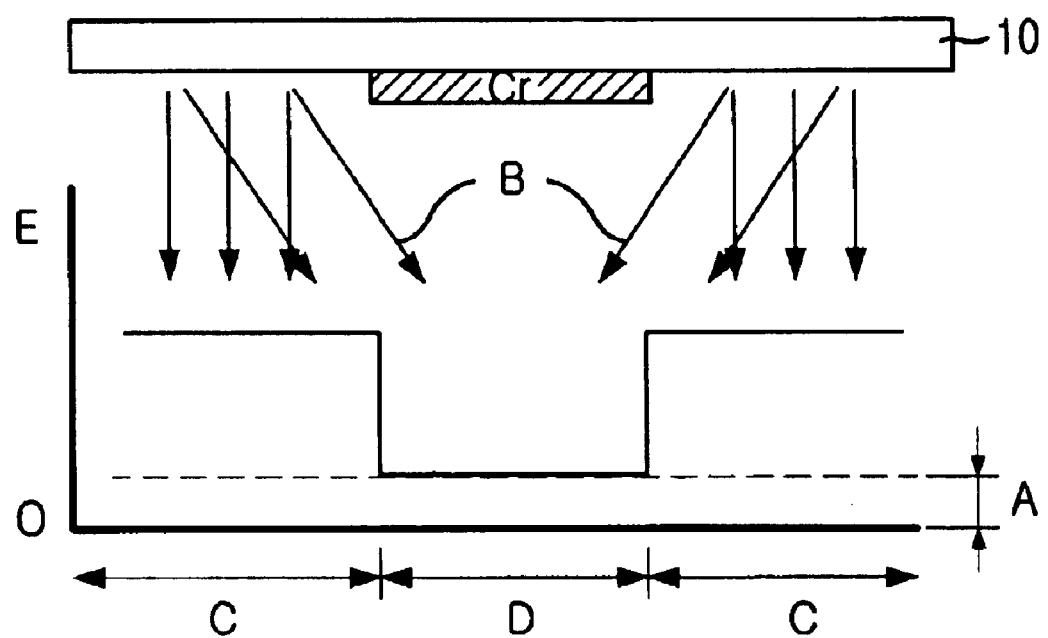
FIG. 1 is a schematic diagram for describing the flare noise phenomenon that occurs due to stray lights at an image plane.

Other objects and aspects of the present invention will become apparent from the following description of the embodiments with reference to the accompanying drawings, wherein:

FIG. 1 is a schematic diagram for describing the flare noise phenomenon occurring due to stray light at an image plane. Additionally, it should be noted that the flare noise occurs when light reaches undesignated areas in addition to originally designated areas, and thus, is different from diffraction.

With reference to FIG. 1, the vertical axis represents light energy (E) whereas the horizontal axis represents each designated area for the light energy (E). As shown in FIG. 1, such stray light denoted as 'B' causes the light energy (E) to arrive at an area 'D', where it was shielded from the arrival of E. Thus only area 'C' is the intended recipient of E. Hence, it is preferable that light energy (E) should have a value of '0' at area 'D'. However, the energy level graphed in FIG. 1 shows that there exists light energy having a level of 'A' in area 'D' because of the stray light.

Figure 2:
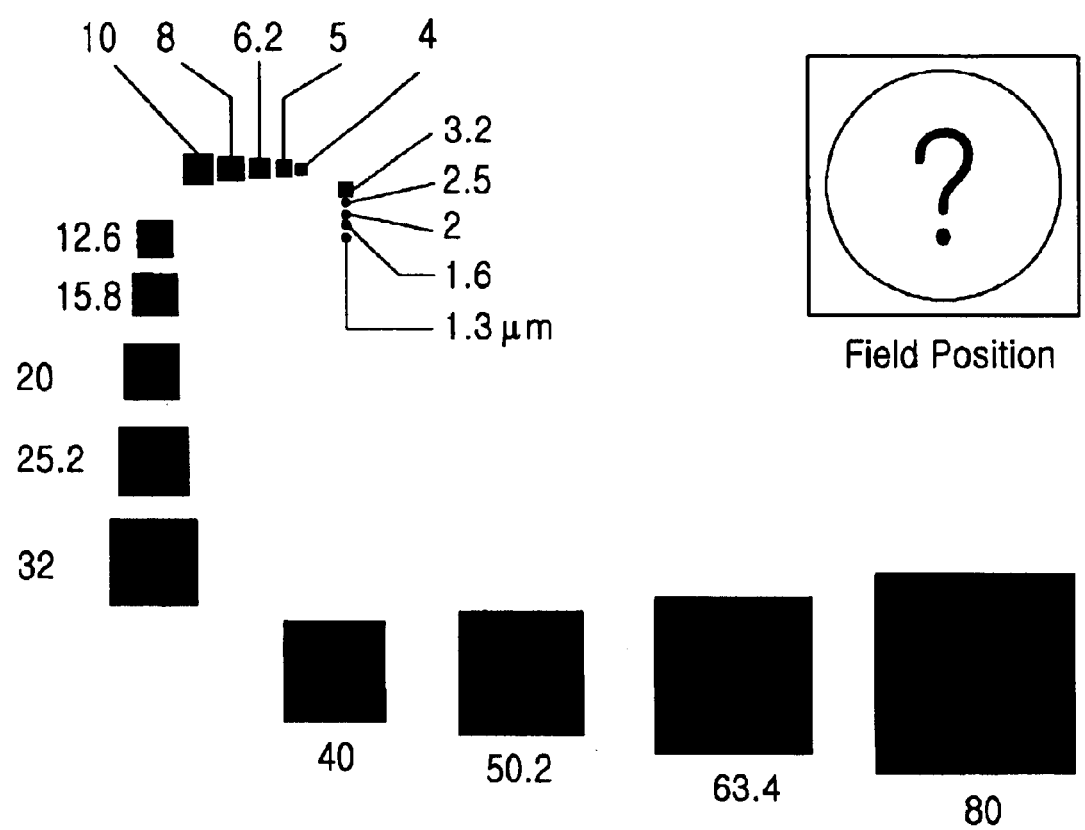
FIG. 2 is a schematic diagram depicting block sizes of the kirk's split for describing the Kirk's method.

FIG. 2 is a schematic diagram illustrating block sizes of the Kirk's split for describing the Kirk's method. Referring to FIG. 2, in the Kirk's method, a mask is formed by splitting each block with a predetermined size. In this case, sizes of the split blocks disappearing at a particular area with a specific light energy vary in accordance with amounts of flare noise. At this time, the flare noise can be expressed in a relationship of the disappearing block size against a particular light energy level, and this relationship is expressed in the following equation.

$$F(\text{Flare noise})[\%] = E0/Ex \times 100 \qquad \text{Eq. 1}$$

Herein, $E0$ represents the basic energy required for all photo registry patterns to disappear in a state of non-blocking while $Ex$ represents energy required for a block with a size 'x' to disappear due to flare noise when the block having a size 'x' is in a blocking state. In addition, 'x' is a box size wherein the flare noise is saturated by being distinguished from diffraction, and a DRAM process commonly uses a value of the box size in a range of from about 5 $\mu$m to about 10 $\mu$m.

The most difficult problem in implementing the Kirk's method on the mask for developing an actual device is to set an appropriate light energy and attain a sufficient space for inserting the split blocks. The reason for this problem is because the light energy of the mask for use of the actual device is determined by a device pattern unlike that of the Kirk's method wherein an arbitrary determination of light energy is applied.

However, it is still possible to obtain a minimum area and a necessary energy level through the appropriate use of a mask layout and an exposure mode of photo exposure equipment. The present invention is to provide splits released by the Kirk's method, i.e., dummy patterns that can be established on an actual mask.

To accomplish this establishment, there are used a light energy of incident lights having a plurality of different areas during photo exposure and a mask having a plurality of dummy patterns with different sizes for detecting the flare noise at each designated area in accordance with the Kirk's method.

Figure 3:
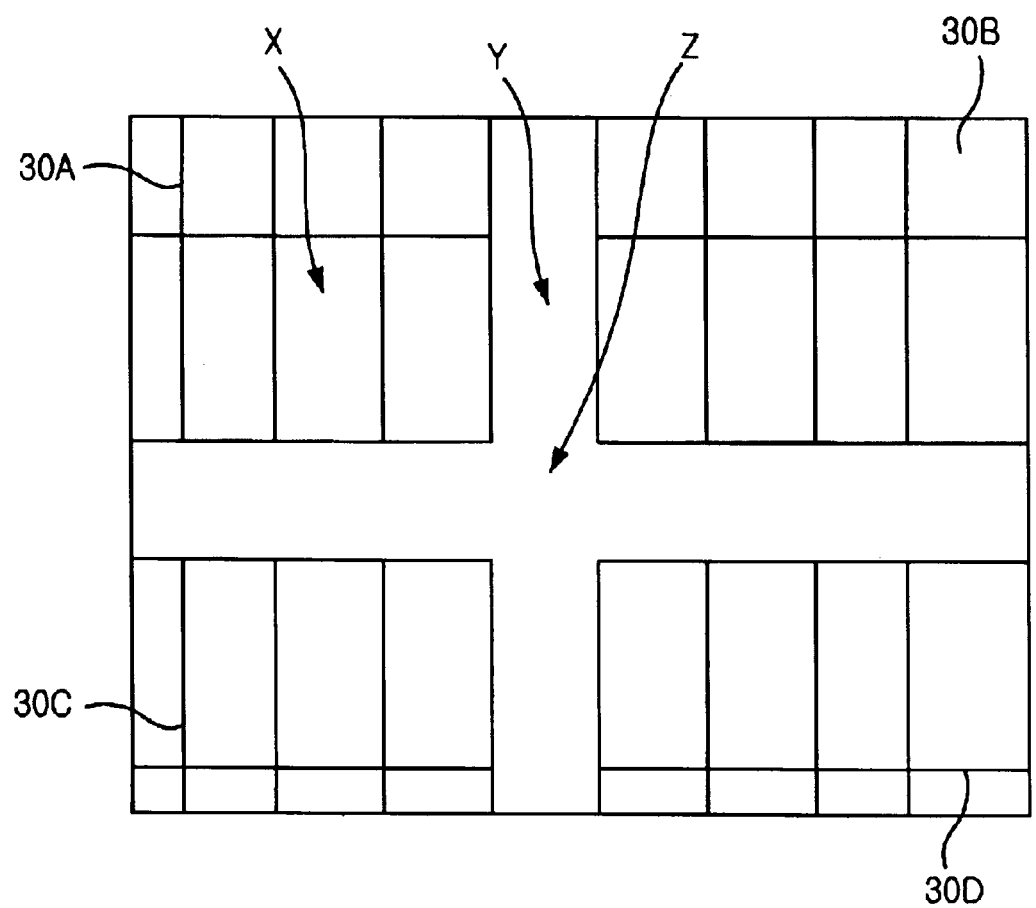
FIG. 3 is a plane view illustrating a mask layout for embodying the Kirk's method at the mask in accordance with a preferred embodiment of the present invention.

Referring to FIG. 3, if it is assumed that reference numerals 30A to 30D represent areas of the patterns, each being duplicated by one application of photo exposure, i.e., shots, the unit light energy 'E' attained by one application of photo exposure in these areas will be investigated and a region including the areas, that is, the unit energy 'E' with respect to the photo exposure area X for one application of the photo exposure will also be investigated.

Meanwhile, since there is an error within a blade of the photo exposure equipment itself, a region other than a main pattern for a device layout, e.g., a scribe lane is made to perform the photo exposure by superposing the neighbored shots 30A to 30D. In accordance with the preferred embodiment of the present invention, the reference numeral 'Y' in FIG. 3 is superposed and photo exposed when performing the photo exposure to the neighboring two shots 30A and 30B. Accordingly, 'Y' is doubly photo exposed, and thus, it becomes the photo exposure area of two applications wherein twice of the unit light energy '2E' is inputted.

Also, reference numeral 'Z' in FIG. 3 is superposed and photo exposed when four neighboring shots 30A to 30D are photo exposed, and thus, the photo exposure on 'Z' occurs four times, resulting in the photo exposure area of four applications wherein four times of the unit light energy '4E' is inputted.

Hence, the above described light energy, i.e., 'E', '2E' and '4E' will be investigated at the region 'X', 'Y' and 'Z', respectively. In the case where appropriate block sizes, that is, dummy patterns having various sizes are inserted into the regions 'Y' and 'Z', it is possible to detect the flare noise through combinations of the light energy 'E', '2E' and '4E' with each of the dummy patterns.

Hereinafter, a method for calculating the block size of the dummy pattern mandated to be inserted into each light energy level and a method for calculating the flare noise through the above method will be described in more detail.

Figure 4:
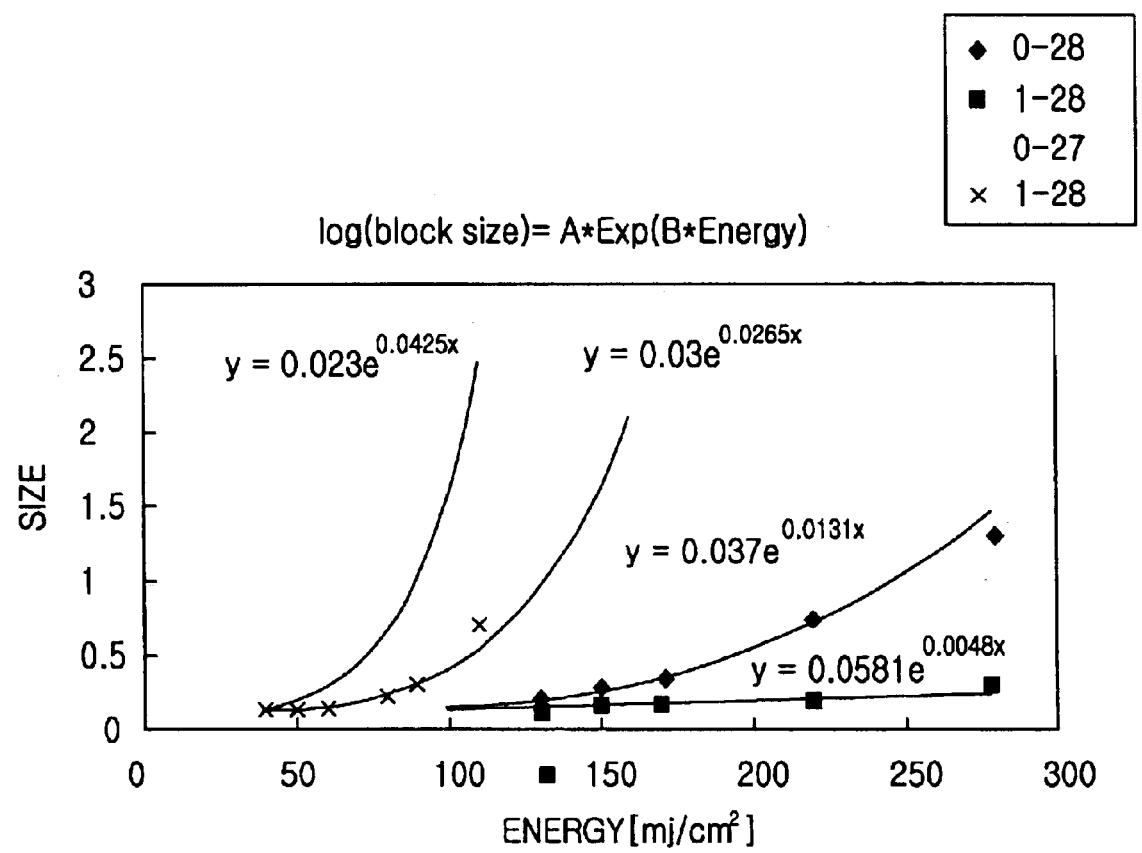
FIG. 4 is a graph showing a relationship between block size and light exposure energy in accordance with the Kirk's method.

FIG. 4 shows the relationship between the block size having a square shape and the light energy, and the following equation expresses this relationship. Also, the block size is expressed in a log scale.

$$\text{Log(block size)} = A^* \text{Exp}(B^* \text{Energy}) \qquad \text{Eq. 2}$$

Herein, 'A' and 'B' express fitting coefficients. As an example, the light energy in the preferred embodiment of the present invention is fixed with a level of 'E', '2E' and '4E'. According to experimental data, it is analyzed that the fitting coefficient 'A' nearly does not affect changes of other variables and is possible to become a constant as in an average value. In this case, it is also possible to set a relationship between the size of the disappearing dummy pattern and the fitting coefficient 'B'. For instance, if the dummy pattern size is fixed in a size of about 5 $\mu$m, the light energy with respect to the fitting coefficient 'B' can be calculated and this value is related to a value for the flare noise.

The following Table 1 shows the relationship between the fitting coefficient 'A' or 'B' and the flare noise F while Table 2 shows the relationship between the fitting coefficient and the fixed light energy. Herein, the unit light energy E is set with a value of 50.

TABLE 1

| A | B | Size ($\mu$m) | E | F |
|---|---|---|---|---|
| 0.035 | 0.01 | 5 | 299.43 | 3.67 |
| 0.035 | 0.012 | 5 | 249.52 | 4.41 |
| 0.035 | 0.014 | 5 | 213.88 | 5.14 |
| 0.035 | 0.016 | 5 | 187.44 | 5.88 |
| 0.035 | 0.018 | 5 | 166.35 | 6.62 |
| 0.035 | 0.02 | 5 | 149.71 | 7.35 |
| 0.035 | 0.022 | 5 | 136.10 | 8.08 |
| 0.035 | 0.024 | 5 | 124.76 | 8.82 |
| 0.035 | 0.026 | 5 | 115.16 | 9.55 |
| 0.035 | 0.028 | 5 | 106.94 | 10.29 |
| 0.035 | 0.03 | 5 | 99.81 | 11.02 |
| 0.035 | 0.032 | 5 | 93.57 | 11.76 |

TABLE 2

| E | Size ($\mu$m) | B |
|---|---|---|
| 200 | 1.2 | 0.0041 |
| 200 | 1.5 | 0.0081 |
| 200 | 2 | 0.0108 |
| 200 | 3 | 0.0131 |
| 200 | 4 | 0.0142 |

TABLE 2-continued

| E | Size (μm) | B |
|---|---|---|
| 200 | 5 | 0.0150 |
| 200 | 6 | 0.0155 |
| 200 | 7 | 0.0159 |
| 200 | 8 | 0.0163 |
| 100 | 1.2 | 0.0082 |
| 100 | 1.5 | 0.0162 |
| 100 | 2 | 0.0215 |
| 100 | 3 | 0.0261 |
| 100 | 4 | 0.0285 |
| 100 | 5 | 0.0299 |
| 100 | 6 | 0.0310 |
| 100 | 7 | 0.0318 |
| 100 | 8 | 0.0325 |
| 50 | 1.2 | 0.0163 |
| 50 | 1.5 | 0.0323 |
| 50 | 2 | 0.0430 |
| 50 | 3 | 0.0522 |
| 50 | 4 | 0.0569 |
| 50 | 5 | 0.0599 |
| 50 | 6 | 0.0620 |
| 50 | 7 | 0.0637 |
| 50 | 8 | 0.0650 |

For example, if the dummy patterns with a size of about 7 μm disappeared or was about to disappear in the light energy of '4E', that is, a value of 200, Table 2 is referred to determine the value of the fitting coefficient 'B' with inputted values of 200 for the light energy '4E' and 7 μm for the dummy pattern size.

At this time, Table 2 provides the value of 0.0159 for the fitting coefficient 'B', and the closest value to this determined fitting coefficient 'B' is retrieved in Table 1. Since the closet value of the fitting coefficient 'B' in Table 1 is 0.016, the value for the flare noise is determined to be 5.88%. In Table 1, 5 μm is set to be a referential dummy pattern size.

As another example for determining the fitting coefficient and the flare noise, if the dummy patterns with a size of about 8 μm all disappear in the light energy of '4E', that is, in a value of 200, then values of the fitting coefficient 'B' with respect to each dummy pattern size are retrieved from a next light energy level '2E', i.e., a value of 100 in Table 2. At this time, in the case that the dummy pattern of which size is about 5 μm disappears in the light energy level '100', the fitting coefficient 'B' has a value of 0.0299. With reference to this obtained fitting coefficient value, the flare noise is determined to be 10.29% in Table 1. Also, if the flare noise becomes greater than about 10%, photo exposure equipment is required to be compensated.

In other words, when detecting the flare noise, the closest fitting coefficient 'B' is firstly retrieved among the areas in a sequential order from the area having the highest light energy level according to the dummy pattern size and the light energy, by referring to Table 2 including the fitting coefficient with respect to the dummy pattern size and the light energy. Then, with use of the retrieved fitting coefficient 'B' and the dummy pattern size, values for the fitting coefficient and the flare noise are retrieved again from Table 1.

This procedure can be operated with a simple real time scheme through the use of an optical microscope without employing a scanning electron microscope (SEM).

In summary, the preferred embodiment of the present invention uses a characteristic of the superposition between neighboring shots when photo exposing a mask layout of a device and photo exposure equipment. At these superposed areas, e.g., scribe lanes, dummy patterns corresponding to split blocks having different sizes are formed in accordance with the Kirk's method. It is also possible to check instantaneously disappearances of the dummy patterns allocated at each different area, which result in subsequent disappearances of light energy, through the use of an optical microscope when photo exposing. Therefore, it is not required to put forth additional efforts for equipment maintenance and equipment inspection time, and a flare noise effect can also be minimized.

In other words, by following the preferred embodiment of the present invention, it is possible to detect instaneously, the flare noise of the photo exposure equipment from a wafer of a semiconductor device. Because of the ability of instantaneous detection, such additional efforts for equipment maintenance and equipment inspection time are not required and it is also possible to minimize the flare noise effect of the semiconductor device.

While the present invention has been described with respect to certain preferred embodiments, it will be apparent to those skilled in the art that various changes and modifications may be made without departing from the scope of the invention as defined in the following claims.

What is claimed is:

1. A method for detecting flare noise in a semiconductor device, comprising the steps of:
    preparing a mask having a plurality of light-exposed areas and a plurality of light-blocking patterns with different sizes for detecting flare noises on each of the light-exposed areas;
    projecting the plurality of light-blocking patterns on a wafer by performing a photolithography process with the mask;
    preparing a first relation between the flare noise and a fitting coefficient according to a size of a light-blocking pattern which is disappeared or about to be disappeared at a specific light energy; and
    determining the flare noise according to the fitting coefficient determined by the first relation.

2. The method as recited in claim 1, wherein light energy of incident light for each of the light-exposed areas varies in accordance with the number of superposed shots, at the step of projecting the plurality of light-blocking patterns onto the wafer.

3. The method as recited in claim 2, wherein the area with the superposed shots includes a scribe lane.

4. The method as recited in claim 1, wherein each of the plurality of light-blocking patterns is formed in the shape of a square.

5. The method as recited in claim 1, wherein the step of preparing the first relation includes the steps of:
    preparing a second relation between the light energy, and the fitting coefficient according to the sizes of the light-blocking patterns which have disappeared or are about to disappear at different light energies,
    determining the fitting coefficient based on the second relation by finding the size of the light-blocking pattern which is disappeared or about to be disappeared at the specific light energy.

* * * * *